United States Patent [19]

Terashima

[11] Patent Number: 4,733,375
[45] Date of Patent: Mar. 22, 1988

[54] NON-VOLATILE MEMORY CIRCUIT

[75] Inventor: Yoshiyuki Terashima, Nagano, Japan

[73] Assignee: Seiko Epson Corporation, Tokyo, Japan

[21] Appl. No.: 738,791

[22] Filed: May 28, 1985

[30] Foreign Application Priority Data

May 28, 1984 [JP] Japan .................. 59-107701
Nov. 29, 1984 [JP] Japan .................. 59-252614

[51] Int. Cl.$^4$ .............................................. G11C 7/02
[52] U.S. Cl. ...................................... 365/206; 365/104
[58] Field of Search ................ 307/542; 365/206, 207, 365/208, 94, 103, 104

[56] References Cited

U.S. PATENT DOCUMENTS 3,744,036  7/1973  Frohman-Bentchkowsky ... 365/185

FOREIGN PATENT DOCUMENTS 2087183  5/1982  United Kingdom ................ 365/206

OTHER PUBLICATIONS

Dov Frohman-Bentchkowsky, "A Fully Decoded 2048-Bit Electrically Programmable FAMOS Read-Only Memory", IEEE J. Solid State Circuits, vol. SC-6, pp. 301–306, Oct. 1971.

Primary Examiner—Joseph A. Popek
Attorney, Agent, or Firm—Blum Kaplan

[57] ABSTRACT

A non-volatile memory circuit which may be formed on the same memory chip as a MOS integrated circuit for an electronic watch. The non-volatile memory circuit includes a power source and a high voltage application terminal for writing data. A non-volatile memory device is coupled between the power source and the high voltage application terminal. A voltage limiting circuit for limiting the voltage applied to the non-volatile memory is coupled between the power source and the high voltage application terminal. A current limiting circuit for limiting the current applied to the non-volatile memory is coupled between the high voltage application terminal and the non-volatile memory, whereby the non-volatile memory is protected from stray voltage and current writing data into the non-volatile memory. The invention may also be applied to an EEPROM arrangement in which the data may be read to or erased from the non-volatile memory without erroneous writing or erasure due to static noise or other outside noise.

29 Claims, 9 Drawing Figures

NON-VOLATILE MEMORY CIRCUIT

BACKGROUND OF THE INVENTION

The invention is generally directed to a non-volatile memory circuit in an integrated circuit for an electronic watch and in particular to an integrated circuit for an electronic watch wherein an EPROM (Erasable Programmable ROM) or EEPROM (Electrically Erasable Programmable ROM) are formed on the same chip as a watch circuit. The circuit allows data to be written into the ROM and to be erased when desired.

Figure 1:
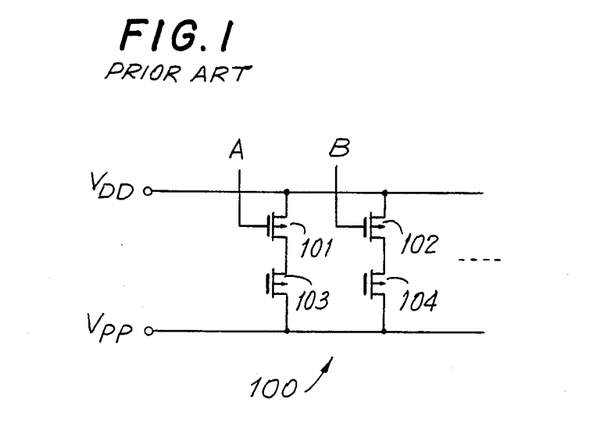
FIG. 1 is a circuit diagram of a non-volatile memory circuit which allows electrical writing constructed in accordance with the prior art.

It is known to utilize FAMOS (Floating-gate Avalanche Injection MOS) devices in an integrated circuit for an electronic watch to create an EPROM which can be written into. Reference is made to FIG. 1 wherein a circuit, generally indicated as 100, in accordance with the prior art is depicted. Circuit 100 utilizes FAMOS devices which are assembled in an integrated circuit also used for an electronic watch. Circuit 100 has transistors 101 and 102 with the gate electrodes coupled to terminals A and B, respectively, which are preset to one of two levels. The terminals are preset to either $V_{DD}$=high of to $V_{SS}$=low. Transistors 101 and 102 act as switches for the FAMOS devices 103 and 104 which are connected in series with source-drain paths of transistors 101 and 102. When a high negative voltage is applied to terminal $V_{PP}$, transistors 101 and 102 are preset to the "low" value and electrons are injected into the FAMOS devices. As the above-injected electrons in the FAMOS devices are maintained semi permanently, the FAMOS devices act as a semiconductor memory which is non-volatile and which allows data to be written electrically.

However, an actual embodiment of the circuit shown in FIG. 1 as part of an integrated circuit for an electronic watch has several real world problems. Often, electrons are injected into the FAMOS devices by mistake as a result of noise or static electricity from outside of the circuit, such as from the static electricity on a wearer's wrist. This results because the drain of one of the FAMOS is connected to the drain of the other FAMOS and the commonly connected drains are connected to a pad which is used as a high voltage applied terminal for writing $V_{PP}$. Accordingly, there is a need to provide a circuit for writing data in and erasing data from a non-volatile memory when a high voltage is applied but which limits the voltage and current when noise from the outside of the circuit, such as static electricity is introduced.

SUMMARY OF THE INVENTION

The invention is generally directed to a non-volatile memory circuit having a power source and a high-voltage application terminal. The circuit includes a non-volatile memory device coupled between the power source and the high voltage application terminal. A voltage limiter limits the voltage applied to the non-volatile memory means and is coupled between the power source and the high voltage application terminal. A current limiter limits the current applied to the non-volatile memory device and is coupled between the high voltage application terminal and a non-volatile memory device. As a result, the non-volatile memory device is protected from stray voltage and current.

Accordingly, it is an object of the instant invention to provide an improved non-volatile memory circuit.

Another object of the invention is to provide an improved non-volatile memory circuit which allows for electrical writing data in and erasing of data from the non-volatile memory device.

A further object of the invention is to provide an improved non-volatile memory circuit for use on the same chip as the integrated circuit for an electronic watch.

Still another object of the invention is to provide a non-volatile memory circuit which allows writing data in the non-volatile memory device but has both a current and a voltage limiter to prevent static electricity and other electrical sources from outside the circuit from affecting the non-volatile memory device data.

Yet another object of the invention is to provide an improved non-volatile memory circuit which utilizes FAMOS devices as the non-volatile memory device.

Still other objects and advantages of the invention will in part be obvious and will in part be apparent from the specification.

The invention accordingly comprises the features of construction, combinations of elements, and arrangements of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings in which.

DETAILED DESCRIPTION OF THE PREFERRED EMBODIMENTS

Figure 2:
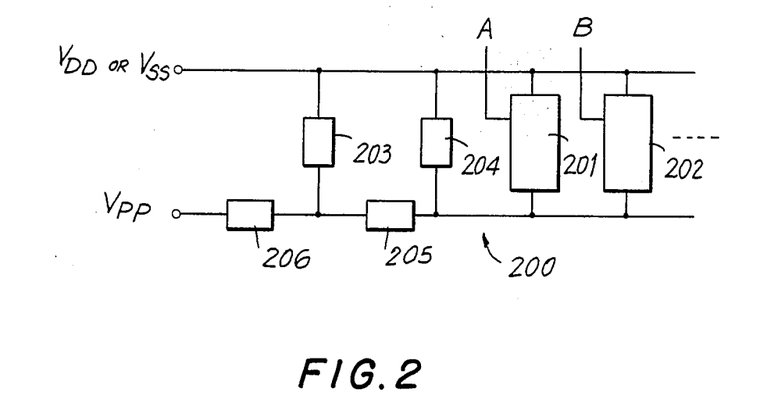
FIG. 2 is a block diagram of a non-volatile memory circuit which is adapted to electrically write in the memory, constructed in accordance with the invention.

Reference is made to FIG. 2 wherein a block diagram of a circuit, generally indicated as 200, constructed in accordance with the invention is depicted. Circuit 200 includes non-volatile memories 201 and 202 coupled in parallel with each other and other non-volatile memories (not shown). One side of the parallel connection of memories 201, 202 is coupled to a source at terminal $V_{DD}$ (or $V_{SS}$). The other side of the parallel connection of memories 201, 202 is coupled through series connected current limiting elements 205, 206 to high voltage applied terminal $V_{PP}$ used for writing data in the memories 201, 202. Voltage limiting element 204 is connected in parallel with non-volatile memories 201 and 202 between terminals $V_{DD}$ (or $V_{SS}$) and $V_{PP}$ current limiting element 205.

Voltage limiting elements 203 and 204 limit the voltage applied to non-volatile memories 201 and 202 when the applied voltage is greater than that required to write or erase. Transistors, diodes or capacitors can be used as voltage limiting devices 203 and 204. On the other hand, current limiting devices 205 and 206 are used to limit the current which is passed through the memory devices. Transistors, resistors, inductors, diodes or capacitors can be used as current limiting elements 205 and 206. By providing current and voltage limiting elements in circuit 200 erroneous writing and erasing is substantially reduced.

Figure 3:
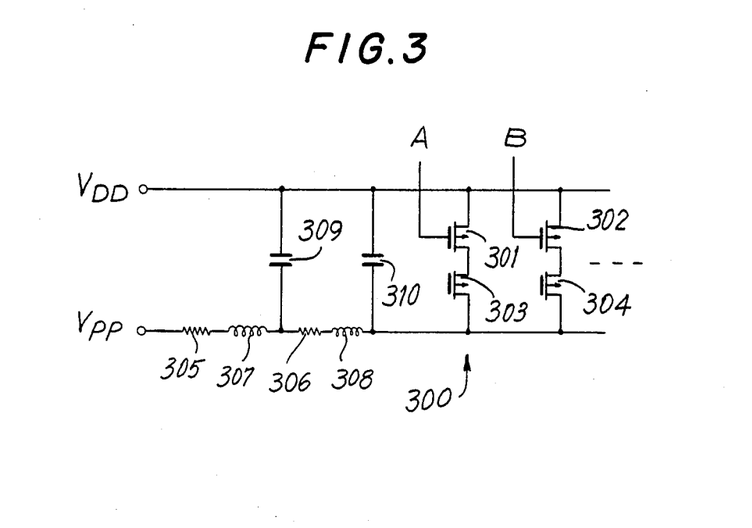
FIG. 3 is a circuit diagram of a non-volatile memory circuit adapted to write data in the memory, constructed in accordance with a first embodiment of the invention.

Reference is made to FIG. 3 wherein a non-volatile memory circuit, generally indicated as 300, and adapted to allow writing and erasing, constructed in accordance with an embodiment of the invention is depicted. Circuit 300 includes FAMOS devices 303 and 304 controlled by transistor switches 301 and 302. Transistors 301, 302 have their gates respectively connected to control terminals A, B as described above. The voltage limiting element present in circuit 300 is capacitor 310 coupled in parallel to the respective memories depicted by FAMOS 301 and transistor 303 and FAMOS 302 and transistor 304, between terminal $V_{DD}$ and inductor 308, capacitor 309 coupled between terminal $V_{DD}$ and the junction between inductor 307 and resistor 306. DC resistances 305 and 306 formed in a p$^-$ well and parasitic inductances 307 and 308 formed in aluminum wiring are series connected and used as the current limiting elements. Capacitors 309 and 310 are formed in P$^+$-N$^-$ regions in the integrated circuit. The above-described circuit acts as a low pass filter which filters out the high frequency components of outside noise and static electricity. The low pass filter also increases the time required for the application of the high voltage when writing into the storage device is desired. However, this additional period is only several milliseconds and is not generally a problem. The low pass filter may be constructed utilizing resistance and capacitance or inductance and capacitance. However, one pair of the above components is insufficient to adequately eliminate the high frequency disturbances and two low pass filters are utilized. As more low pass filters are used, the voltage drop across resistors 305 and 306 increases so that it is desirable to design the low pass filters taking into consideration the voltages required for writing and the frequency spectrum of external noise.

Figure 4:
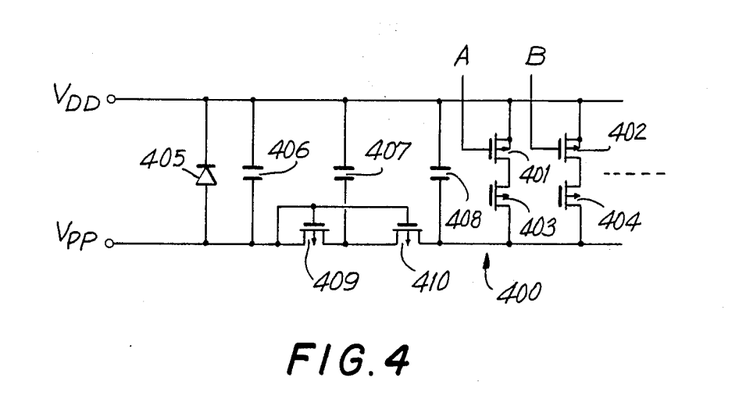
FIG. 4 is a circuit diagram of a non-volatile memory circuit adapted to write data in the memory, constructed in accordance with a second embodiment of the invention.

Reference is next made to FIG. 4 wherein a non-volatile memory circuit generally indicated as 400, constructed in accordance with a second embodiment of the invention is depicted. Circuit 400 includes the non-volatile memory components including switching transistors 401 and 402 and FAMOS devices 403 and 404, connected as described above. The voltage limiting elements for the non-volatile memory devices include a diode 405 and capacitor 406 coupled in parallel between terminals $V_{DD}$ and $V_{pp}$, capacitors 406 and 407 coupled between terminal $V_{DD}$ and the junctions between high break-down transistors 409 and 410 and between high break-down transistors 410 and FAMOS 403, 404. Diode 405 is constructed as a p$^+$-N$^-$ diode. Ordinarily diodes are formed parasitically on an integrated circuit. However, diode 405 is formed by controlling the concentration of N$^-$. As a result, the break down voltage of diode 405 can be set at a low voltage. The breakdown voltage is controlled so as to fall within the normal writing range of the non-volatile memory device, that is approximately $-15$ V. As a result, when noise from the outside with a comparatively high DC component invades the circuit, the peak level of the noise is cut off at about 15 volts. The voltage applied to the FAMOS devices is, however, insufficient to cause writing to the gates of the FAMOS devices without transistors 401 and 402 being switched ON. Capacitors 406, 407, 408 are formed as p$^+$-N$^-$ capacitors.

The current limiting elements in circuit 400 are high break-down voltage MOS transistors 409 and 410 having their respective gates commonly joined to terminal $V_{PP}$ and which are adapted to receive high voltage. High break-down voltage transistors 409 and 410 and diode 405 and capacitors 406, 407, 408 act as a low-pass filter to filter out the high frequency components of the external noise.

Figure 5:
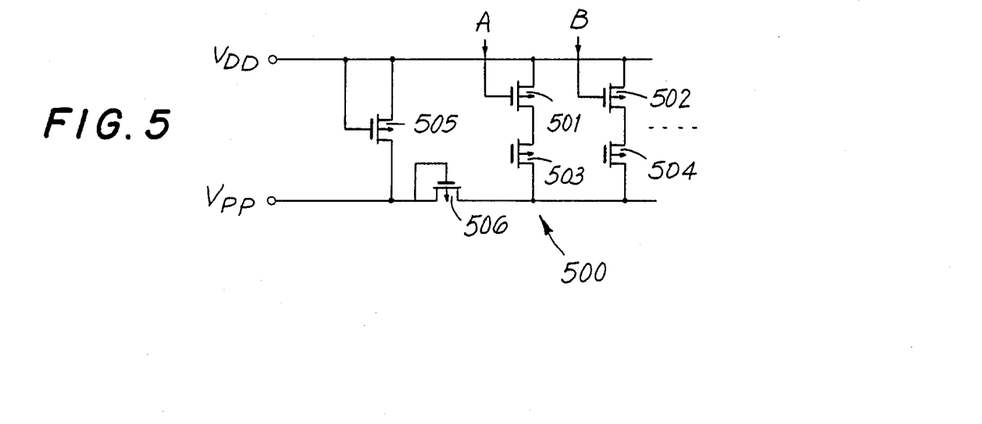
FIG. 5 is a circuit diagram of a non-volatile memory circuit adapted to write data in the memory, constructed in accordance with a third embodiment of the invention.

Reference is next made to FIG. 5 wherein a non-volatile memory circuit, generally indicated as 500, constructed in accordance with a third embodiment of the invention is depicted. Circuit 500 includes switching transistors 501, 502 and FAMOS devices 503 and 504 which form the non-volatile memory circuit. Elements 501, 502, 503 and 504 are connected in the same manner as shown and described above. The voltage limiting element in circuit 500 is the break-down voltage of the drain of a transistor 505 connected across terminals $V_{DD}$ and $V_{PP}$ with its drain coupled to terminal $V_{DD}$. Generally, in an enhancement type MOS transistor, where the gate electrode and source electrode are connected, a channel is not formed and current will not flow between the source and drain. However, when high voltage applied to the drain reaches a certain break-down level, current begins to flow abruptly. Transistor 505 is formed so that the break-down voltage, that is the voltage above which current begins to flow, is set to be slightly higher than the voltage required to write in the FAMOS devices. In this way, a write signal is not negatively affected by the voltage limiting element. However, a noise signal with voltage greater than the voltage required for writing into the FAMOS devices is reduced to a voltage level only slightly higher than that ordinarily required to write on the FAMOS devices. This will not cause data to be written into the FAMOS devices unless terminals A or B are selected, thereby turning on transistor switches 501 or 502.

The current limiting element is a transistor 506 which has the gate and drain electrodes connected to terminal $V_{PP}$. The drain of transistor 506 has a diode construction adapted to allow current flow in a direction opposite to $V_{DD}$. As a result, the breakdown voltage of the diode is set so that high voltages from outside of the circuit are limited.

Therefore, in accordance with this embodiment, a non-volatile memory circuit which limits both voltage and current which serves to prevent unwanted effects from high voltages applied from outside of the circuit is provided. This circuit is particularly advantageous to manufacture as only two additional transistors are required to improve the reliability of the circuit for writing into a FAMOS device.

Figure 6:
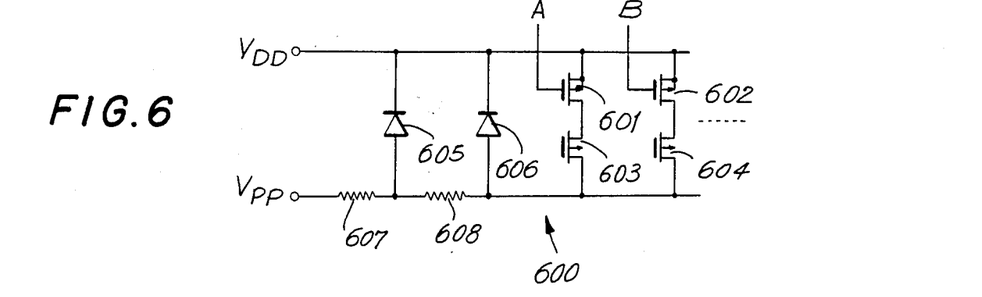
FIG. 6 is a circuit diagram of a non-volatile memory circuit adapted to write data in the memory, constructed in accordance with a fourth embodiment of the invention.

Reference is next made to FIG. 6 wherein a non-volatile circuit, generally indicated as 600, which allows for writing of data into the non-volatile memory in accordance with a third embodiment of the invention is depicted. Circuit 600 has switching transistors 601 and 602 coupled to terminals A, B, respectively for switching FAMOS elements 603, 604 as described above. The voltage limiting elements are diodes 605 and 606 which are coupled, respectively, between terminal $V_{DD}$ and the junctions between resistors 607 and 608 and between resistors 608 and FAMOS 603, 604. Diodes 605 and 606 are formed where the P type and N-type doping of a P+-N+ junction is adjusted. The breakdown voltages of diodes 605 and 606 are set slightly higher than the voltage required for writing. As described above, this insures that random outside noise does not cause data to be stored in FAMOS devices 603 and 604 unless terminals A and B are turned ON. The current limiting elements are resistors 607 and 608 which are made up of p-wells to limit abrubt punch through current while not interfering with the breakdown voltage effects of diodes 605 and 606. As a result, circuit 600 contains both voltage limiting and current limiting elements to protect the integrity of the data in FAMOS devices 603 and 604. The P-well doping in circuit 600 is less than that in the embodiment of FIG. 4. As a result, the break-down voltage required in this embodiment is higher than that required in the embodiment in FIG. 3. Therefore, circuit 600 is more insensitive to disturbances caused by external noise and static.

Figure 7:
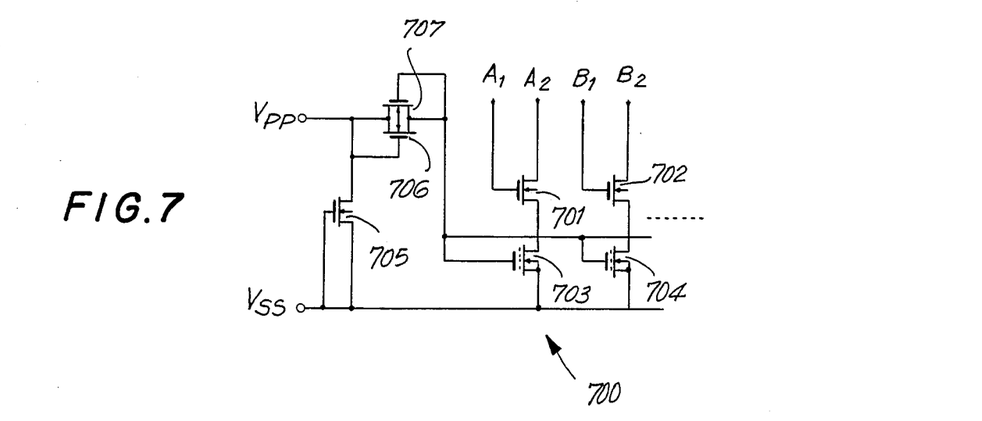
FIG. 7 is a circuit diagram of a non-volatile memory circuit adapted to write data in the memory and erase data from the memory, constructed in accordance with a fifth embodiment of the invention.

Reference is next made to FIG. 7 wherein a non-volatile memory circuit adapted to allow writing and erasing of data, generally indicated as 700, is depicted. Circuit 700 includes switching transistors 701 and 702 for respectively switching double-layer gate FAMOS transistors 703 and 704. The gate electrode of transistor 701 is coupled to a terminal A1. The source electrode thereof is coupled to terminal A2 whereas the drain electrode is coupled to the FAMOS device 703. Likewise, the gate and source electrodes of transistor 702 are coupled to terminals B1 and B2, respectively, whereas the drain electrode of transistor 702 is coupled to FAMOS device 704.

This is an EEPROM circuit which allows for the writing and erasing of data in FAMOS devices 703 and 704. To write data, terminal A1 is set equal to $V_{DD}$ and terminal A2 is set to $V_{SS}$ which turns transistor 701 ON. Then, approximately +21 V is applied to $V_{PP}$ which causes a signal to be stored in FAMOS device 703.

To erase data, terminal A1 is set to $V_{DD}$ and terminal A2 is set to +21 V. As a result, +21 V is applied to the drain of transistor 703. Then, $V_{SS}$ is applied to the gate electrode of transistor 703. As a result, a voltage difference between the gate and drain equal in magnitude to the voltage applied for writing, but of opposite polarity is applied to erase the data. Transistors 703 and 704 are constructed so that the insulating layer formed between a floating gate and the drain is partially thinned so that electrons are more easily stored and discharged by the polarity of the voltage applied to the layer between the gate and drain.

No DC circuit is produced between high voltage terminals $V_{PP}$ and Vhd SS of the EEPROM circuit. As a result, it is possible to write and erase data using very little energy. However, such an EEPROM is also very sensitive to outside and static noise which creates a potential for mistaken data to be written into or for written data to be erased from the EEPROM by mistake. Circuit 700 utilizes transistors 705, 706 and 707 as an adjunct to the EEPROM circuit as voltage and current limiting elements. Transistor 705, which is coupled between terminals $V_{PP}$ and $V_{SS}$, with its gate coupled to terminal $V_{SS}$, is configured to utilize the break-down voltage of an N-channel transistor as the voltage limiting element. Likewise, transistors 706 and 707 are utilized to limit the current flowing to transistors 703 and 704. Transistors 706 and 707 are coupled with their respective source-drain paths in parallel and their drains respectively coupled to opposed sides of said parallel connection.

Figure 8:
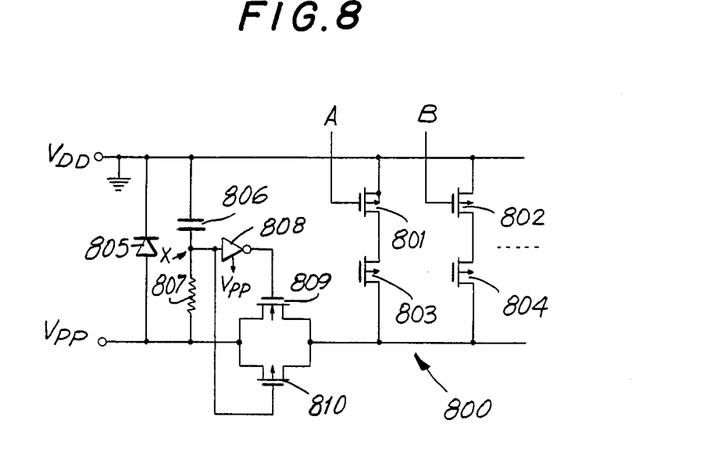
FIG. 8 is a circuit diagram of a non-volatile memory circuit adapted to write data in the memory, constructed in accordance with a sixth embodiment of the invention.

Reference is next made to FIG. 8 wherein a non-volatile memory circuit, generally indicated as 800, constructed in accordance with another embodiment of the invention is depicted. Circuit 800 has switching transistors 801 and 802 for switching FAMOS devices 803 and 804 as described above. The voltage limiting element is a diode 805 coupled between terminals $V_{DD}$ and $V_{PP}$ and produced in the same way as diode 405 in circuit 400 shown in FIG. 4. N-channel transistor 809 and P-channel transistor 810 are coupled with their respective source-drain paths in parallel and are used as part of the current limiting elements. The current limiting elements also include an RC circuit formed from a resistor 807 and a capacitor 806 coupled in series between terminals $V_{DD}$ and $V_{PP}$. An inverter 808 is coupled between a point X, between resistor 807 and capacitor 806, and the gate electrode of transistor 809. The gate electrode of transistor 810 is coupled to point X. When data is to be written into FAMOS devices 803, 804, a voltage of approximately −15 V is applied to $V_{PP}$. The gate voltage of inverter 808 is reduced from the $V_{DD}=0$ volts level in a negative direction controlled by the time constant of the RC circuit. When the gate voltage of diode 808 crosses the threshold voltage of the inverter, P-channel transistor 810 and N-channel transistor 809 are switched ON. As a result, the voltage applied to $V_{PP}$ is transferred to FAMOS devices 503 and 504 and the electrical charge is injected into the FAMOS device selected by terminals A or B.

Circuit 800 reacts differently in the case where a pulse of short duration and high voltage enters the circuit at terminal $V_{PP}$. Generally, noise such as that created by static is of a pulse type in which a high voltage is applied for a very brief period of time. When the time constant of the RC circuit formed by resistor 807 and capacitor 806 is large relative to the width of the pulse, the voltage at point X does not exceed the threshold level of diode 808 as it is maintained near the voltage of $V_{DD}$. P-channel transistor 809 and N-channel transistor 810 are not switched ON and the static electrical noise applied to $V_{PP}$ is cut off. As a result, the voltage applied to $V_{PP}$ is not allowed to pass through to the FAMOS devices unless the voltage is applied over a time period determined by the time constant of the RC circuit formed by resistor 807 and capacitor 806.

Figure 9:
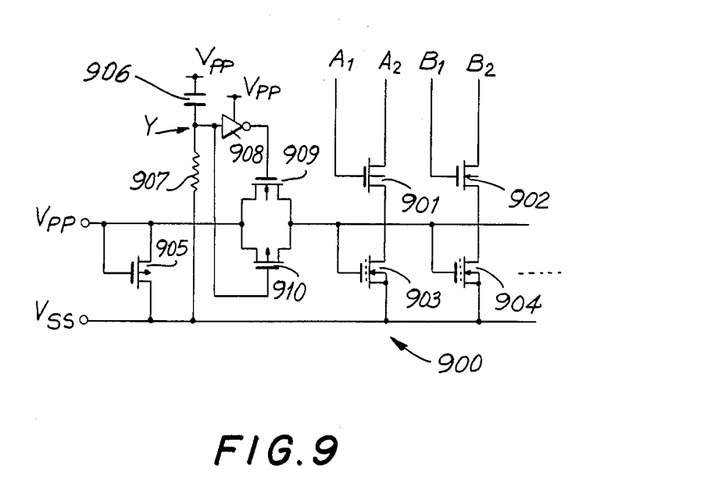
FIG. 9 is a circuit diagram of a non-volatile memory circuit adapted to write and erase data constructed in accordance with a seventh embodiment of the invention.

Reference is next made to FIG. 9 wherein a non-volatile memory circuit, generally indicated as 900 which is adapted to electrically read and erase data, constructed in accordance with another embodiment of the invention is depicted. Circuit 900 is an EEPROM circuit which allows for both writing and erasing of data from two-layer gate transistors 903, 904. The EEPROM circuit operates in the same manner as described above with respect to the embodiment in FIG. 7. However, the voltage and current protection circuits are similar to the protection circuits of circuit 800. The voltage limiting circuit is a transistor 905 in which the gate and source electrodes are coupled to $V_{PP}$ and the drain electrode is coupled to terminal $V_{SS}$. As a result, transistor 905 operates as a diode similar to diode 805 in circuit 800 (FIG. 8).

The current limiting elements in FIG. 9 are the same as those in FIG. 8. An RC circuit is formed by a resistor 907 and a capacitor 906 coupled between terminals $V_{PP}$ and $V_{SS}$. An inverter 908 has its gate electrode coupled to a point Y between resistor 907 and capacitor 906. An N-channel transistor 909 and a P-channel transistor 910 are coupled to terminal $V_{PP}$ in the same manner as transistors 909 and 910 in circuit 800. The output of inverter 908 is coupled to the gate electrode of transistor 909. The gate electrode of transistor 910 is coupled to point Y.

When data is to be written into transistor 903, terminal A1 is set equal to $V_{DD}$ and terminal A2 is set equal to $V_{SS}$. As a result, transistor 901 is switched ON. A voltage +21 V is applied to the gate of transistor 903. As a result, the upper gate and drain are at levels +21 V and $V_{SS}$ respectively so that electrons are stored in the floating gate by a tunnel effect which also increases the threshold voltage.

On the other hand, when erasing data from transistor 903, terminal $A_1$ is set to $V_{DD}$ and terminal $A_2$ is set to +21 V. As a result, $V_{SS}$ and +21 V are applied to the gate and drain electrodes of transistor 903, respectively. This results in the electrons in the floating gate of transistor 903 being erased. Erasure is accomplished by applying a voltage having an opposite polarity to that utilized when writing. Transistors 903 and 904 are formed so that the thickness of the insulating film between the floating gate and the drain is particularly reduced. As a result, the tunnel effect occurs easily.

In the EEPROM circuit of FIG. 9, no DC circuit is produced between high voltage terminal $V_{PP}$ (+21 V) and $V_{SS}$ when writing or erasing data. As a result, it is possible to both write and erase data with very little energy. However, such an EEPROM is particularly sensitive to noise from the outside and static which have a tendency to produce errors, such as writing or erasing at inappropriate times.

Accordingly, a protection circuit is required. The protection circuit includes transistor 905 as a voltage limiting element and resistor 907, capacitor 906, inverter 908 and transistors 909, 910, as current limiting elements. The protection circuit operates in the same manner as the protection circuit in FIG. 8. That is, when writing data, a voltage of +21V is applied to terminal $V_{PP}$. When data is to be erased, a voltage of 0V is applied to terminal $V_{PP}$. In any event, a certain period of time is required to switch on transistors 909, 910. A pulse of short width pulse to the time constant of the RC circuit formed by resistor 907 and capacitor 606 fails to turn ON transistors 909, 910. As a result, noise signals of high voltage but short pulse width are not transmitted to the gate electrodes of memories 903 or 904.

The non-volatile memory circuits shown in FIGS. 2–9 include two memory elements in each circuit. However, additional memory circuits can be added in parallel to the memory circuits shown. The non-volatile memory circuits shown in FIGS. 3–9 utilize resistors, diodes, transistors, capacitors, and so on as voltage limiting elements and resistors, transistors, inductors as current limiting elements. As a result of a combination of the voltage limiting elements and the current limiting elements with the non-volatile memory circuit, erroneous writing caused by noise generated by other devices and static electricity generated from the human body can be prevented. In addition, in the non-volatile memory circuits of FIGS. 7 and 9, the voltage and current protection circuits prevent erroneous erasure of data resulting from similar noise.

Because of the compactness and simplicity of the voltage and current limiting circuits, the area of chip used for the non-volatile memory circuits constructed in accordance with the invention are almost the same size as a conventional non-volatile memory integrated circuit. This is due to the fact that the differences between the sizes of the ordinary transistors and the transistors used in this invention as voltage and current limiting elements are small. In particular, the channel width of a transistor constructed in accordance with the invention is about 50 $\mu$m (W=50 $\mu$m) and the channel length of the transistor is 4 $\mu$m, (L=4 $\mu$m). In the circuits constructed in accordance with the invention, the voltage is dropped by about 2–3 volts by the current limiting elements. As a result, it is possible to assemble such a circuit in an electronic watch without any difficulty, preferably on the same chip as the other integrated elements of the watch. Accordingly, a non-volatile memory circuit for writing and erasing data located on the same integrated circuit as the components for an electronic watch, which is particularly insensitive to static and outside noise is provided.

It will thus be seen that the objects set forth above, among those made apparent from the preceding description, are efficiently attained and, since certain changes may be made in the above constructions, without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What claimed is:

1. A non-volatile memory circuit having a power source and a high voltage application terminal for writing data, comprising:
   non-volatile memory means coupled between the power source and the high voltage application terminal for storing data wherein the non-volatile memory means includes at least one memory device and switch means for permitting selective writing of data into each memory device;
   voltage limiting means for limiting the voltage applied to the non-volatile memory means, coupled between the power source and the high voltage application terminal; and current limiting means for limiting the current applied to the non-volatile memory means, coupled between the high voltage application terminal and the non-volatile memory means;

whereby the non-volatile memory means is protected from erroneous writing of data from outside noise and static noise.

2. The non-volatile memory circuit of claim 1 wherein the non-volatile memory means includes at least one memory device and switch means for permitting selective writing of data into and erasing of data from each memory device.

3. The non-volatile memory circuit of claim 2 wherein each memory device is a double-layer gate transistor.

4. The non-volatile memory circuit of claim 2 wherein the switch means includes a transistor switch for each memory device.

5. The non-volatile memory circuit of claim 1 wherein each of the memory devices is a floating-gate avalanche injection MOS device coupled between the high voltage application terminal and the switch means.

6. The non-volatile memory circuit of claim 1 wherein the switch means includes a transistor switch for each memory device.

7. The non-volatile memory circuit of claim 1 wherein the voltage limiting means includes at least one diode.

8. The non-volatile memory circuit of claim 7 wherein the voltage limiting means further includes at least one capacitor in parallel with one of said diodes.

9. The non-volatile memory circuit of claim 8 and further including at least one high break-down voltage transistor as said current limiting means.

10. A non-volatile memory circuit having a power source and a high voltage application terminal for writing data, comprising:
non-volatile memory means coupled between the power source and the high voltage application terminal for storing data;
voltage limiting means for limiting the voltage applied to the non-volatile memory means, coupled between the power source and the high voltage application terminal; and
current limiting means for limiting the current applied to the non-volatile memory means, coupled between the high voltage application terminal and the non-volatile memory means;
whereby the non-volatile memory means is protected from erroneous writing of data from outside noise and static noise, wherein the voltage limiting means includes at least one diode and at least one capacitor in parallel with one of said diodes and further including at least one high break-down voltage transistor as said current limiting means and further including at least two series connected high break-down voltage transistors and a capacitor coupled between one of the source and drain of each said high break-down transistor and said power source.

11. The non-volatile memory circuit of claim 1 wherein the voltage limiting means includes a transistor adapted to have a selected break-down voltage for limiting voltage applied to the memory means.

12. The non-volatile memory circuit of claim 1 wherein the voltage limiting means includes at least one capacitor.

13. The non-volatile memory circuit of claim 1 wherein the current limiting means includes at least one resistor.

14. The non-volatile memory circuit of claim 1 wherein the current limiting means includes the breakdown voltage of the drain-substrate junction of at least one transistor in which the gate and drain electrodes are tied together.

15. The non-volatile memory circuit of claim 1 wherein the voltage limiting means include a high break-down voltage transistor adapted upon breakdown at a selected voltage above the desired voltage of the high voltage application terminal to prevent application of voltages higher than said selected voltage to the memory means.

16. The non-volatile memory circuit of claim 1 wherein the current limiting means includes at least one inductor.

17. The non-volatile memory circuit of claim 1 wherein the current limiting means includes at least one inductor and at least one resistor in series.

18. A non-volatile memory circuit having a power source and a high voltage application terminal for writing data, comprising:
non-volatile memory means coupled between the power source and the high voltage application terminal for storing data;
voltage limiting means for limiting the voltage applied to the non-volatile memory means, coupled between the power source and the high voltage application terminal; and
current limiting means for limiting the current applied to the non-volatile memory means, coupled between the high voltage application terminal and the non-volatile memory means, wherein the current limiting means includes at least one inductor and at least one resistor in series wherein the resistor and inductor are respectively formed in a P⁻ well and a parasitic inductance in integrated wiring of the circuit;
whereby the non-volatile memory means is protected from erroneous writing of data from outside noise and static noise.

19. The non-volatile memory circuit of claim 18, wherein the voltage limiting means includes at least one capacitor to define a low-pass filter with said resistor and inductor.

20. The non-volatile memory circuit of claim 19, and including at least two of said low-pass filters.

21. A non-volatile memory circuit having a power source and a high voltage application terminal for writing data, comprising:
non-volatile memory means coupled between the power source and the high voltage application terminal for storing data;
voltage limiting means for limiting the voltage applied to the non-volatile memory means, coupled between the power source and the high voltage application terminal; and
current limiting means for limiting the current applied to the non-volatile memory means, coupled between the high voltage application terminal and the non-volatile memory means, wherein the current limiting means includes two transistors of like conductivity type, one of the source and drain and the gate electrodes of the first transistor and one of the source and drain electrode of the second transistor being coupled to the high voltage application terminal and the gate and the other of the source and drain electrodes of the second transistor and the other of the source and drain electrode of the first transistor being coupled to the non-volatile memory means;

whereby the non-volatile memory means is protected from erroneous writing of data from outside noise and static noise.

22. The non-volatile memory circuit of claim 21, wherein the voltage limiting means includes at least one diode.

23. A non-volatile memory circuit having a power source and a high voltage application terminal for writing data, comprising:

non-volatile memory means coupled between the power source and the high voltage application terminal for storing data;

voltage limiting means for limiting the voltage applied to the non-volatile memory means, coupled between the power source and the high voltage application terminal; and current limiting means for limiting the current applied to the non-volatile memory means, coupled between the high voltage application terminal and the non-volatile memory means, wherein the current limiting means includes a resistor and a capacitor in series between the power source and the high voltage application terminal, an inverter, the input of the inverter being coupled to a point between the resistor and the capacitor, a pair of transistors of opposite conductivity type coupled with their respective source-drain paths in parallel between the high voltage application terminal and the non-volatile memory means, the gate electrode of one of the transistors being coupled to the point between the resistor and the capacitor and the gate electrode of the other transistor being coupled to the output of the inverter wherein the conductance of the transistors as a current limiting means is controlled using the resistor-capacitor time constant circuit;

whereby the non-volatile memory means is protected from erroneous writing of data from outside noise and static noise.

24. The non-volatile memory circuit of claim 23, wherein the time constant of the resistor-capacitor circuit is selected to be larger than the width of pulses of noise to prevent the application of such pulses to the memory means.

25. The non-volatile memory circuit of claim 24, wherein the voltage limiting means includes a transistor adapted to have a selected break-down voltage for limiting the voltage applied to the memory means.

26. The non-volatile memory circuit of claim 23 wherein the voltage limiting means includes at least one diode.

27. The non-volatile memory circuit of claim 23, wherein the voltage limiting means includes a transistor adapted to have a selected break-down voltage for limiting the voltage applied to the memory means.

28. The non-volatile memory circuit of claim 1, wherein the current and voltage limiting means are integrated on the same chip as the non-volatile memory means.

29. The non-volatile memory circuit of claim 28, wherein the circuit is integrated on the same chip as the integrated circuit of a watch.

* * * * *